United States Patent [19]
McKinnon

[11] Patent Number: 6,043,659
[45] Date of Patent: Mar. 28, 2000

[54] MAGNETIC RESONANCE IMAGING SYSTEM WITH NON-LINEAR PREAMPLIFICATION

[75] Inventor: Graeme C. McKinnon, Hartland, Wis.

[73] Assignee: General Electric Company, Milwaukee, Wis.

[21] Appl. No.: 08/961,585

[22] Filed: Oct. 31, 1997

[51] Int. Cl.[7] .................................................. G01V 3/00

[52] U.S. Cl. ...................... 324/322; 324/322; 324/309; 324/300

[58] Field of Search ................................ 324/322, 309, 324/300

[56] References Cited

U.S. PATENT DOCUMENTS

| 4,992,736 | 2/1991 | Stormont et al. | 324/309 |
| 4,994,746 | 2/1991 | Panosh et al. | 324/322 |

Primary Examiner—Christine K. Oda
Assistant Examiner—Brij B. Shrivastav
Attorney, Agent, or Firm—Barry E. Sammons; Christian G. Cabou; Phyllis Y. Price

[57] ABSTRACT

An MRI system performs a scan to acquire NMR signals from which an image can be reconstructed. The NMR signals are compressed prior to digitization by a nonlinear preamplifier, and after digitization, the signal is restored to the correct amplitude by a decompression process. The SNR of the reconstructed image is improved without increasing the size of the analog to digital converter.

10 Claims, 3 Drawing Sheets

MAGNETIC RESONANCE IMAGING SYSTEM WITH NON-LINEAR PREAMPLIFICATION

BACKGROUND OF THE INVENTION

The field of the invention is nuclear magnetic resonance imaging methods and systems. More particularly, the invention relates to the digitization of NMR signals.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The digitized, time domain, NMR signal corresponds to the spatial frequency representation of the object being imaged. This places some non-intuitive requirements on the sampling resolution of the analog-to-digital converter ("ADC"). If it is assumed that the object being imaged uniformly fills the field-of-view of the acquired image data set, the image signal to noise ("SNR"), for a 3D MR acquisition may be expressed as $$imageSNR = k \cdot \sqrt{N_x \cdot N_y \cdot N_z} \cdot v_{cc} / \sqrt{r_{bw}} \ ;$$

where k is a system constant, $N_x$, $N_y$, & $N_z$ are the number of image pixels in the x, y and z direction respectively, $v_{cc}$ is the voxel volume, and $r_{bw}$ is the receiver bandwidth. The NMR signal's SNR, at the point where it has the maximum amplitude, is given by $$timeSNR = k \cdot N_x \cdot N_y \cdot N_z \cdot v_{cc} / \sqrt{r_{bw}} \ .$$

Hence, the SNR of the image may be expressed as follows:

$$imageSNR = timeSNR / \sqrt{N_x \cdot N_y \cdot N_z} \ .$$

A 16 bit ADC sampling the NMR signal has a resolution of ±32768 at the peak of the signal. However if one considers a 2D acquisition of a 256×256 sampling matrix ($N_x$=256, $N_y$=256, $N_z$=1), then the maximum image SNR is just ±128. Typically, for 2D imaging, the image SNR is less than this, so presumably the limiting SNR factors lie elsewhere Now consider a 3D acquisition. With a rapid imaging sequence it is possible to collect a full 3D volume, consisting of isotropic voxels in under 3 minutes. However, for a 256×256×256 sample acquisition, the maximum obtainable image SNR is limited by the 16 bit ADC to just ±8. To bring the 3D image SNR limit up to ±128 would require a 20 bit ADC which is very costly.

SUMMARY OF THE INVENTION

The present invention relates to a receiver for an MRI system, and particularly to a non-linear preamplifier that compresses the amplitude of a received NMR signal such that the SNR is maintained over the entire range of signal amplitudes without increasing the ADC resolution. More specifically, a variable gain preamplifier is connected between the receiver coil and the ADC, and the gain of this preamplifier is controlled as a function of the received NMR signal amplitude to compress the dynamic range of the received NMR signals into the range of the ADC. The digitized NMR signal samples are de-compressed prior to image reconstruction.

A general object of the invention is to increase the SNR of images produced from fast 3DFT acquisitions without increasing the number of bits in the ADC. A non-linear gain preamplifier placed before the ADC has a gain function such as that shown in FIG. 3 which compresses the analog input signal to fit within the range of the ADC. This enables the SNR of low level signals to be improved by setting the gain at low signal levels such that the discretization noise produced by the ADC is less than the signal noise. On the other hand, the number of bits in the digitized signal need not be increased to accommodate high signal levels because the NMR input signal is compressed at high levels to stay in range of the ADC.

DESCRIPTION OF THE PREFERRED EMBODIMENT

Figure 1:
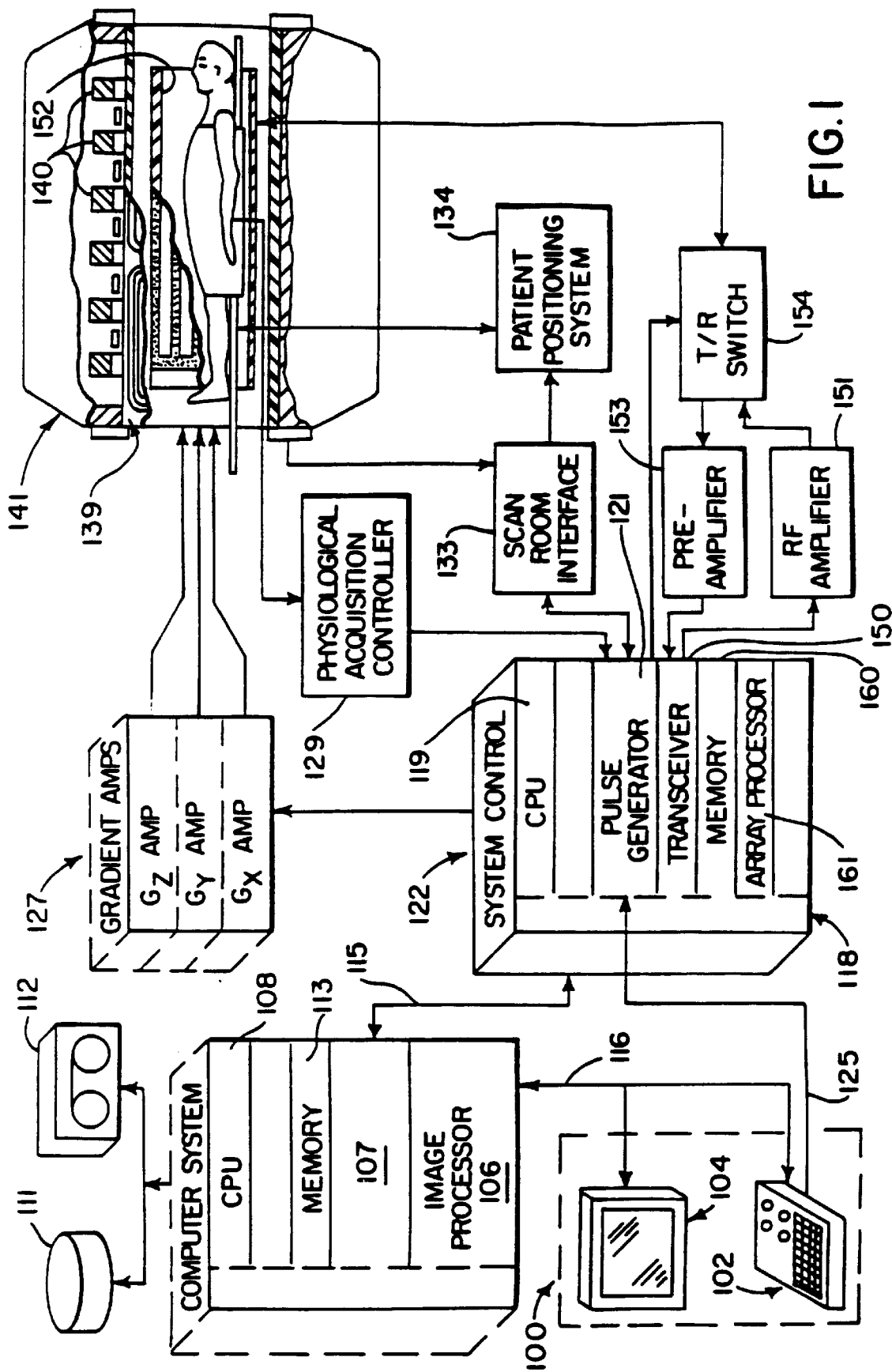
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
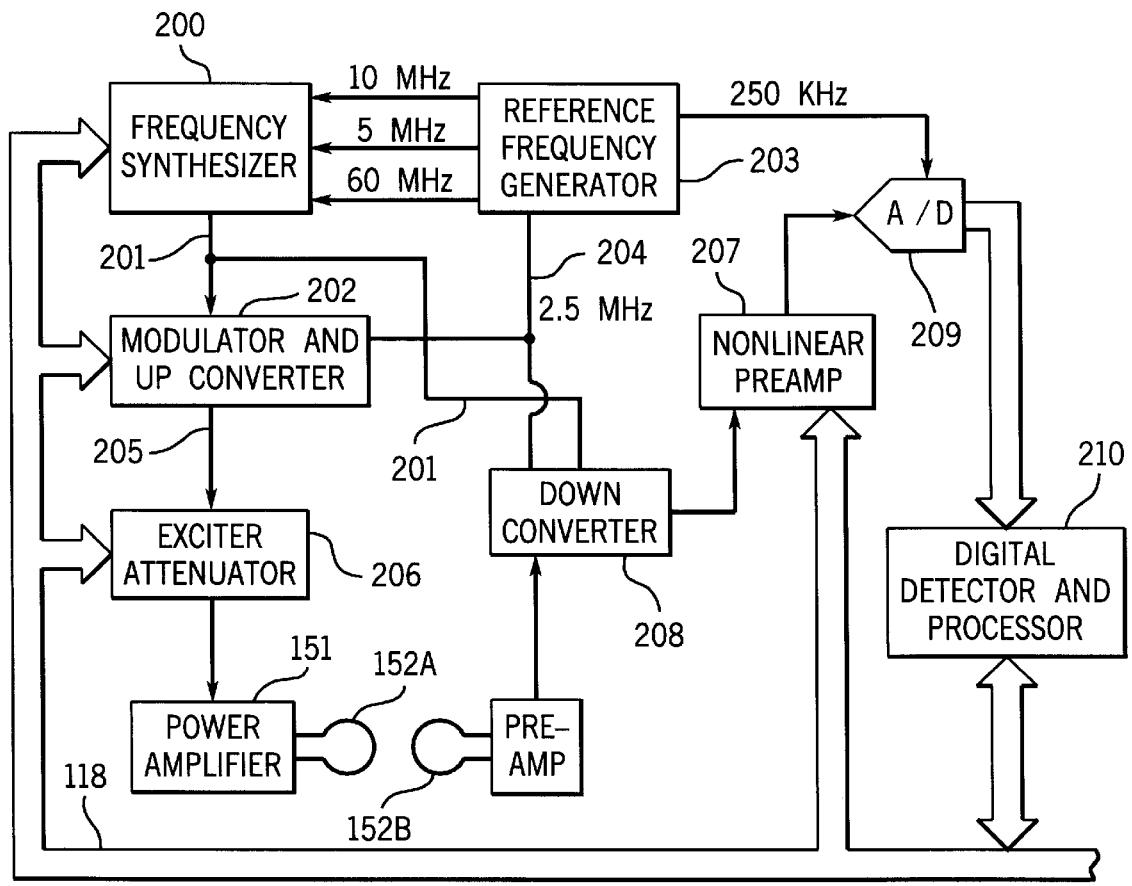
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through a preamplifier 153 to the input of a down converter 208. The received NMR signal is at or around the Larmor frequency, and this high frequency signal is down converted in a two step process by the down converter 208 which first mixes the amplified NMR signal with the carrier signal on line 201 and then mixes the resulting difference signal with the 2.5 MHz reference signal on line 204. A nonlinear preamplifier 207 further amplifies the resulting NMR signal by an amount determined by digital signals $G_a$ and $G_b$ received from the backplane 118. As will be described in more detail below, the nonlinear preamplifier 207 has a nonlinear gain in which low level NMR signals are amplified more than high level NMR signals.

The output of the nonlinear preamplifier 207 is applied to the input of an analog-to-digital converter (ADC) 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
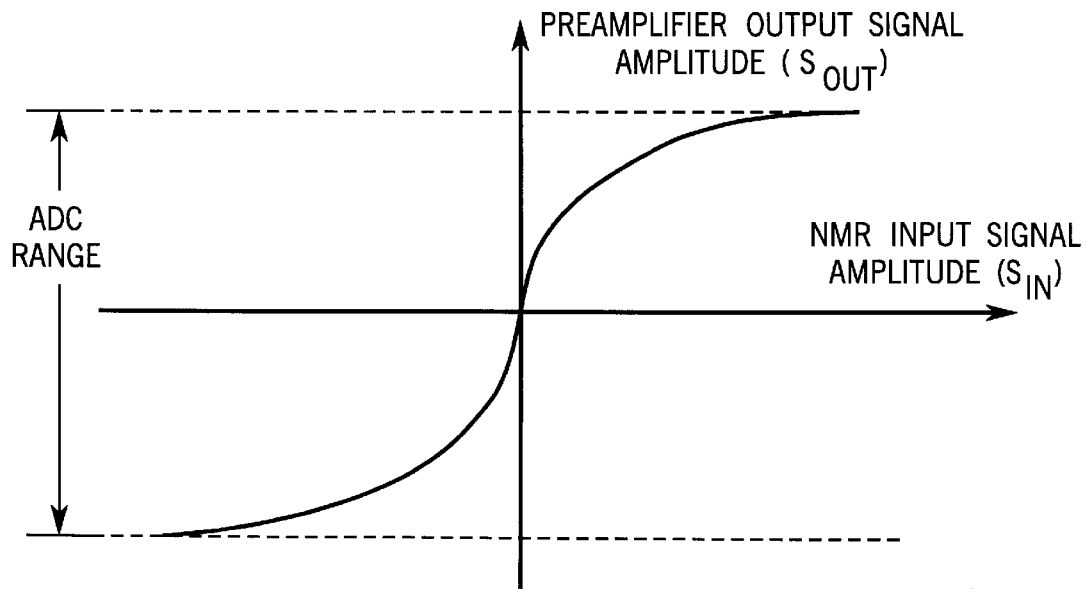
FIG. 3 is a graphic representation of the gain curve of a non-linear preamplifier used in the transceiver of FIG. 2.
Figure 4:
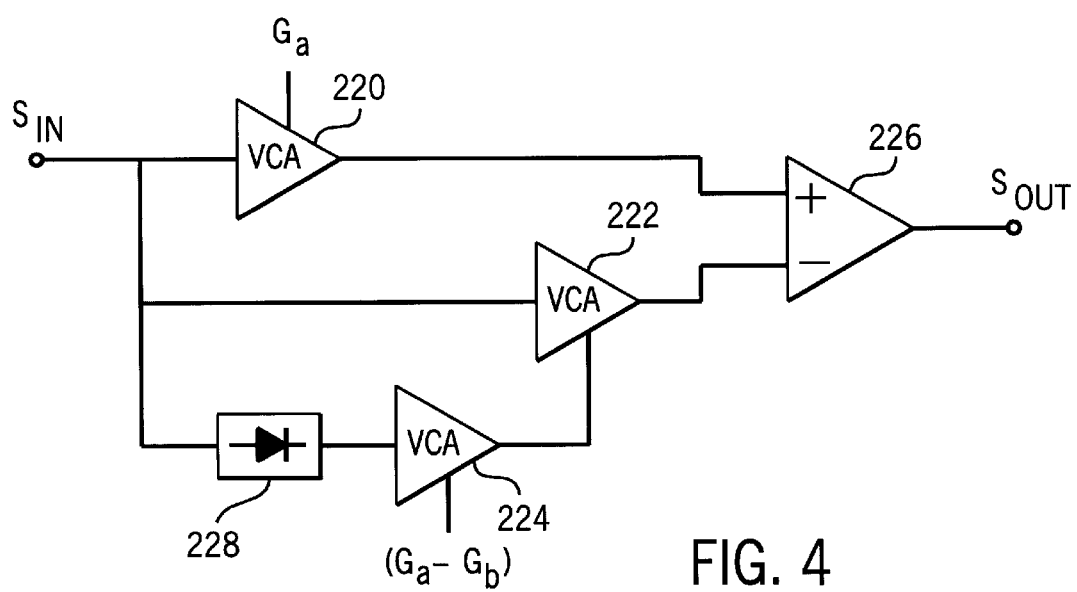
FIG. 4 is an electrical block diagram of non-linear preamplifier which forms part of the transceiver of FIG. 2.

Referring particularly to FIG. 4, the nonlinear preamplifier 207 receives the NMR signal at an input $S_{in}$ and produces an amplified NMR signal at output $S_{out}$. The nonlinear transfer function is illustrated in FIG. 3 and is defined by the following expression:

$$S_{out} = (G_a - (G_a - G_b)|S_{in}|)S_{in}$$

As indicated above, the gain constants $G_a$ and $G_b$ are downloaded through the backplane 118 as part of the pulse sequence prescription. $G_a$ is set such that the input noise is about twice the discretization step of the analog to digital converter 209. $G_b$ is set such that the maximum value of the acquired NMR signal will not saturate the analog to digital converter 209. For example, if the maximum signal to the converter 209 is $C_{max}$, then for a 16-bit analog to digital converter the discretization step is:

$$C_{delta} = C_{max}/2^{15}.$$

If the noise level on the NMR input signal is $S_{noise}$ and its maximum amplitude is $S_{max}$, then the gain for the low amplitude signals is as follows:

$$G_a = 2 \cdot C_{delta}/S_{noise},$$

and the gain for high amplitude signals is:

$$G_b = C_{max}/S_{max}.$$

If $G_b$ is greater than $G_a$, then for optimum signal to noise in the image, $G_b$ should be used over the full range of input signals. That is, $G_a$ is set equal to $G_b$. In this case, the preamplifier 207 performs as a linear amplifier.

A more exact transfer equation used in the preferred embodiment is as follows:

$$S_{out} = [G_a - (G_a - G_b)|S_{norm}|]S_{in}$$

where $S_{norm}$ is the normalized input signal:

$$S_{norm} = S_{in}/S_{max}.$$

The preferred embodiment of the nonlinear preamplifier is comprised of three voltage controlled amplifiers (VCA) 220, 222 and 224, a differential amplifier 226 and a rectifier circuit 228. The rectifier circuit 228 applies a signal to VCA 224 which is equal to the absolute value of the NMR input signal, $|S_{in}|$. The gain of VCA amplifier 224 is set to the value $G_a - G_b$ and its output sets the gain of VCA 222. The NMR input signal $S_{in}$ is also applied to the inputs of both VCA 220 and 222. The gain of VCA 220 is set to the value $G_a$ and the outputs of VCA 220 and 222 are applied to the differential inputs of amplifier 226. The amplifier 226 output provides the compressed NMR signal $S_{out}$.

Before an image can be reconstructed using the digitized compressed NMR data, it must be decompressed. This decompression step is performed immediately after digitization in the system control 122 prior to performing the Fourier transformations in the array processor 161. The decompression formula depends, of course, on the compression formula employed by the nonlinear preamplifier 207. In the preferred embodiment described herein the inversion of the nonlinear preamplifier transfer function is employed.

This involves the solution to a quadratic equation. For positive $S_{in}$, this inversion function is as follows:

$$S_{in} = \left(G_b - \left(G_a\sqrt{(1 - 4G_c S_{out}/G_a^2)}\right)\right)/2G_c,$$

where $G_c = (G_a - G_b)/S_{max}$. A similar equation applies to a negative input signal. The digitized, NMR signals are decompressed using this equation, and then the steps normally used to reconstruct an image are performed. As indicated above, this is typically a two-dimension or three-dimension Fourier transformation.

I claim:

1. A method for producing an image with a magnetic resonance imaging system, the steps comprising:
    a) performing a imaging pulse sequence with the magnetic resonance imaging system;
    b) receiving an NMR signal from a subject to be imaged in response to the pulse sequence;
    c) compressing the NMR signal in a nonlinear preamplifier;
    d) digitizing the compressed NMR signal;
    e) decompressing the digitized, compressed NMR signal to produce a digitized NMR signal;
    f) repeating steps a) through e) to acquire further digitized NMR signals; and
    g) reconstructing an image from the acquired digitized NMR signals.

2. The method as recited in claim 1 in which the nonlinear preamplifier has a transfer function which amplifies small NMR signals more than large NMR signals.

3. The method as recited in claim 2 in which an inversion of the transfer function is employed in step e) to decompress the digitized, compressed NMR signals.

4. The method as recited in claim 2 in which the transfer function is $$S_{out} = (G_a - (G_a - G_b)|S_{in}|)S_{in}$$

and wherein $S_{in}$ is the NMR signal acquired in step b), $S_{out}$ is the compressed NMR signal and $G_a$ and $G_b$ are gain constants.

5. The method as recited in claim 4 in which an inversion of the transfer function is employed in step e) to decompress the digitized, compressed NMR signals.

6. A magnetic resonance imaging system which comprises:
    a magnet for producing a polarizing magnetic field;
    means for producing magnetic field gradients;
    rf excitation means for generating an rf excitation field that produces transverse magnetization in a subject positioned in the magnetic resonance imaging system;
    an rf coil for receiving NMR signals from the subject produced by the transverse magnetization;
    a nonlinear amplifier coupled to the rf coil and being operable to compress the dynamic range of the received NMR signals to produce compressed NMR signals;
    an analog-to-digital converter connected to receive and digitize the compressed NMR signals;
    means for decompressing the digitized NMR signals produced by the analog-to-digital converter and storing the decompressed NMR signals in a memory; and
    image reconstruction means for producing an image of the subject from the stored, digitized NMR signals.

7. The magnetic resonance imaging system as recited in claim 6 in which the nonlinear amplifier has a transfer function which amplifies small NMR signals more than large NMR signals, and in which the decompression means has a transfer function which is the inversion of the nonlinear amplifier's transfer function.

8. The magnetic resonance imaging system as recited in claim 7 in which the nonlinear amplifier is comprised of a plurality of amplifier circuits which collectively have a transfer function as follows:

$$S_{out} = (G_a - (G_a - G_b)|S_{in}|)S_{in}$$

and where $S_{in}$ is the received NMR signal, $S_{out}$ is the compressed NMR signal, and $G_a$ and $G_b$ are gain factors.

9. The magnetic resonance imaging system as recited in claim 8 which includes a pulse generator which is responsive to a pulse sequence prescription to operate the elements of the magnetic resonance imaging system to produce a prescribed image, and the gain factors $G_a$ and $G_b$ form part of the pulse sequence prescription.

10. The magnetic resonance imaging system as recited in claim 8 in which one of the amplifiers is a voltage controlled amplifier.

* * * * *